(12) United States Patent
Zheng et al.

(10) Patent No.: US 8,289,758 B2
(45) Date of Patent: Oct. 16, 2012

(54) MAGNETIC TUNNEL JUNCTION WITH ELECTRONICALLY REFLECTIVE INSULATIVE SPACER

(75) Inventors: Yuankai Zheng, Bloomington, MN (US); Dimitar V. Dimitrov, Edina, MN (US); Wei Tian, Bloomington, MN (US); Dexin Wang, Eden Prairie, MN (US); Zheng Gao, Savage, MN (US); Xiaobin Wang, Chanhassen, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 61 days.

(21) Appl. No.: 12/943,979

(22) Filed: Nov. 11, 2010

(65) Prior Publication Data

US 2011/0049658 A1    Mar. 3, 2011

Related U.S. Application Data

(63) Continuation of application No. 12/239,887, filed on Sep. 29, 2008, now Pat. No. 7,940,551.

(51) Int. Cl.
*G11C 11/16* (2006.01)
(52) U.S. Cl. ........................................... 365/158
(58) Field of Classification Search ................ 365/158
See application file for complete search history.

(56) References Cited

U.S. PATENT DOCUMENTS

| | | | |
|---|---|---|---|
| 6,030,454 A * | 2/2000 | Roeder et al. | 117/104 |
| 6,700,753 B2 | 3/2004 | Singleton | |
| 6,714,444 B2 | 3/2004 | Huai | |
| 6,829,161 B2 | 12/2004 | Huai | |
| 6,838,740 B2 | 1/2005 | Huai | |
| 6,847,547 B2 | 1/2005 | Albert | |
| 6,861,314 B2 * | 3/2005 | Hosotani | 438/257 |
| 6,888,742 B1 | 5/2005 | Nguyen | |
| 6,933,155 B2 | 8/2005 | Albert | |
| 6,950,333 B2 | 9/2005 | Hiramoto | |
| 6,956,766 B2 | 10/2005 | Nakamura | |
| 6,958,927 B1 | 10/2005 | Nguyen | |
| 6,967,863 B2 | 11/2005 | Huai | |
| 6,985,385 B2 | 1/2006 | Nguyen | |
| 6,992,359 B2 | 1/2006 | Nguyen | |
| 7,057,921 B2 | 6/2006 | Valet | |
| 7,088,609 B2 | 8/2006 | Valet | |
| 7,110,287 B2 | 9/2006 | Huai | |

(Continued)

FOREIGN PATENT DOCUMENTS

EP    610 391    12/2005

(Continued)

OTHER PUBLICATIONS

PCT Search Report and Written Opinion dated May 3, 2010, Our Ref: 14597WO00.

(Continued)

*Primary Examiner* — Evan Pert
(74) *Attorney, Agent, or Firm* — Mueting Raasch & Gebhardt PA (57) ABSTRACT

Magnetic tunnel junctions having a specular insulative spacer are disclosed. The magnetic tunnel junction includes a free magnetic layer, a reference magnetic layer, an electrically insulating and non-magnetic tunneling barrier layer separating the free magnetic layer from the reference magnetic layer, and an electrically insulating and electronically reflective layer positioned to reflect at least a portion of electrons back into the free magnetic layer.

18 Claims, 4 Drawing Sheets

U.S. PATENT DOCUMENTS

| | | |
|---|---|---|
| 7,126,202 B2 | 10/2006 | Huai |
| 7,139,188 B2 | 11/2006 | Moore |
| 7,154,769 B2 | 12/2006 | Krieger |
| 7,161,829 B2 | 1/2007 | Huai |
| 7,190,611 B2 | 3/2007 | Nguyen |
| 7,224,598 B2 | 5/2007 | Perner |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,369,427 B2 | 5/2008 | Diao |
| 7,430,135 B2 | 9/2008 | Hua |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,576,956 B2 | 8/2009 | Huai |
| 2002/0009616 A1* | 1/2002 | Kamiguchi et al. ........... 428/692 |
| 2005/0047198 A1* | 3/2005 | Engel et al. .................... 365/158 |
| 2006/0018057 A1* | 1/2006 | Huai ........................... 360/324.2 |
| 2006/0049472 A1 | 3/2006 | Diao |
| 2006/0060901 A1 | 3/2006 | Nakamura |
| 2006/0114716 A1* | 6/2006 | Kai et al. ...................... 365/158 |
| 2007/0177421 A1 | 8/2007 | Sugiyama |
| 2009/0050991 A1 | 2/2009 | Nagai |
| 2009/0218645 A1* | 9/2009 | Ranjan et al. ................. 257/421 |
| 2009/0268352 A1 | 10/2009 | Wang |
| 2009/0302403 A1 | 12/2009 | Nguyen |

FOREIGN PATENT DOCUMENTS

| | | |
|---|---|---|
| EP | 1903624 | 3/2008 |
| EP | 1918937 | 5/2008 |
| EP | 1970911 | 9/2008 |

OTHER PUBLICATIONS

Zheng et al., Low Switching Current Flux-Closed Magnetoresistive Random Access Memory, Journal of Applied Physics, May 15, 2003.

Egelhoff et al., Oxygen as a Surfactant in the Growth of Giant Magnetoresistance Spin Valves, Journal of Applied Physics 82 (12), Dec. 15, 1997.

Slonczewski, Current-Driven Excitation of Magnetic Multilayers, Journal of Magnetism and Magnetic Materials 159 (1996) L1-L7.

Sun, Current-Driven Magnetic Switching in Manganite Trilayer Junctions, Journal of Magnetism and Magnetic Materials 202 (1999) 157-162.

Li et al., Role of Oxygen Exposure in Different Positions in the Synthetic Spin Valves, Journal of Applied Physics, vol. 93, No. 10, May 15, 2003.

U.S. Appl. No. 12/239,884, filed Sep. 29, 2008, Inventor: Zheng.

U.S. Appl. No. 12/239,882, filed Sep. 29, 2008, Inventor: Zheng.

PCT Search Report and Written Opinion dated Feb. 4, 2010.

* cited by examiner

MAGNETIC TUNNEL JUNCTION WITH ELECTRONICALLY REFLECTIVE INSULATIVE SPACER

RELATED APPLICATIONS

This application is a continuation application and claims priority to U.S. patent application Ser. No. 12/239,887, filed on Sep. 29, 2008. The entire disclosure of application Ser. No. 12/239,887 is incorporated herein by reference.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One concern in traditional STRAM design is the thickness tradeoff between of the free layer of the STRAM cell. A thicker free layer improves the thermal stability and data retention but also increases the switching current requirement since it is proportional to the thickness of the free layer. Thus, the amount of current required to switch the STRAM cell between resistance data states is large.

BRIEF SUMMARY

The present disclosure relates to a spin-transfer torque memory that includes a specular insulator spacer. The specular insulator spacer is also referred to as an electrically insulating and electronically reflective layer. The electrically insulating and electronically reflective layer reflects spin electrons back into the free layer to assist in switching the magnetization orientation of the free layer, thus reducing the switching current required for the spin-transfer torque memory unit.

In one particular embodiment, a magnetic tunnel junction includes a free magnetic layer, a reference magnetic layer, an electrically insulating and non-magnetic tunneling barrier layer separating the free magnetic layer from the reference magnetic layer, and an electrically insulating and electronically reflective layer positioned to reflect at least a portion of electrons back into the free magnetic layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a spin-transfer torque memory that includes a specular insulator spacer. The specular insulator spacer is also referred to as an electrically insulating and electronically reflective layer. The electrically insulating and electronically reflective layer reflects spin electrons back into the free layer to assist in switching the magnetization orientation of the free layer, thus reducing the switching current required for the spin-transfer torque memory unit. Utilizing the electrically insulating and electronically reflective layer in a spin-transfer torque memory unit can reduce the required switching by at least 50%, or at least 75%, or at least 90%. While the present disclosure is not so limited, an appreciation of various aspects of the disclosure will be gained through a discussion of the examples provided below.

Figure 1:
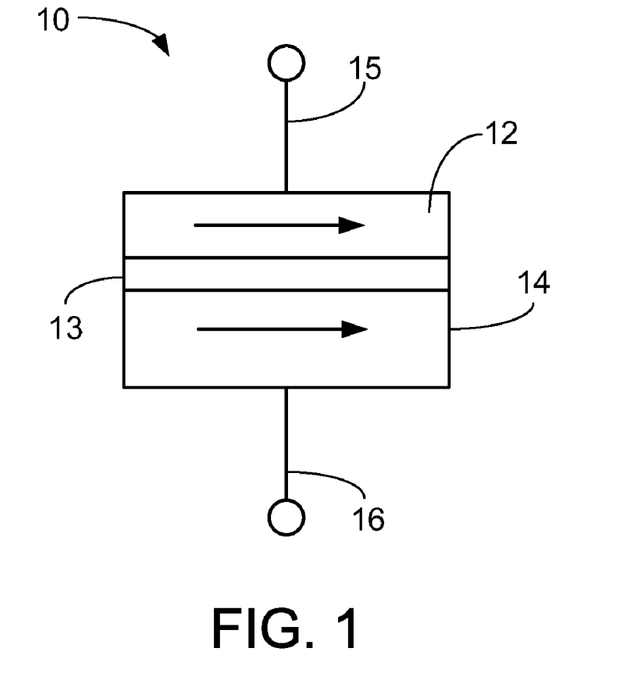
FIG. 1 is a cross-sectional schematic diagram of an illustrative magnetic tunneling junction (MTJ) in the low resistance state.
Figure 2:
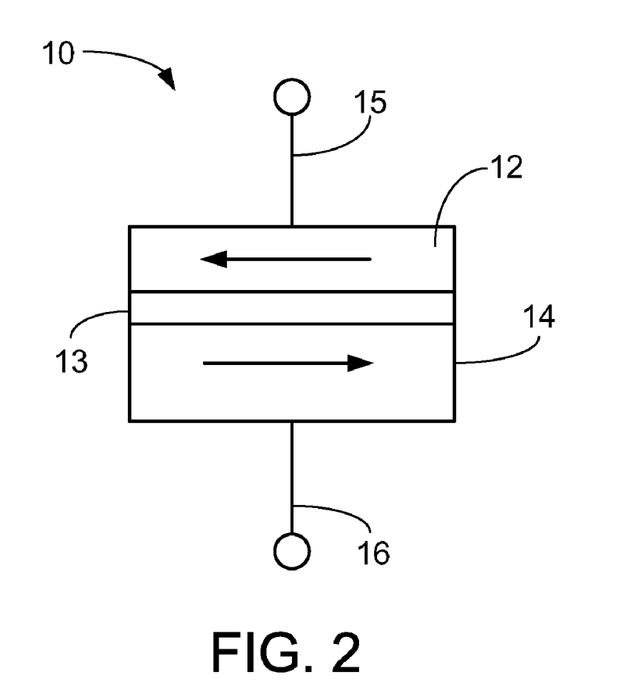
FIG. 2 is a cross-sectional schematic diagram of the illustrative MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any useful memory cell that can switch between a high resistance state and a low resistance state. In many embodiments, the variable resistive memory cell described herein is a spin-transfer torque memory cell.

The MTJ cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunneling barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating tunneling barrier layer 13 may be made of an electrically insulating material such as, for example an oxide material (e.g., $Al_2O_3$, MgO, or TiO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free layer 12, the magnetization orientation of the free layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 may be used to construct a memory device that includes multiple variable resistive memory cells where a data bit is stored in magnetic tunnel junction cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
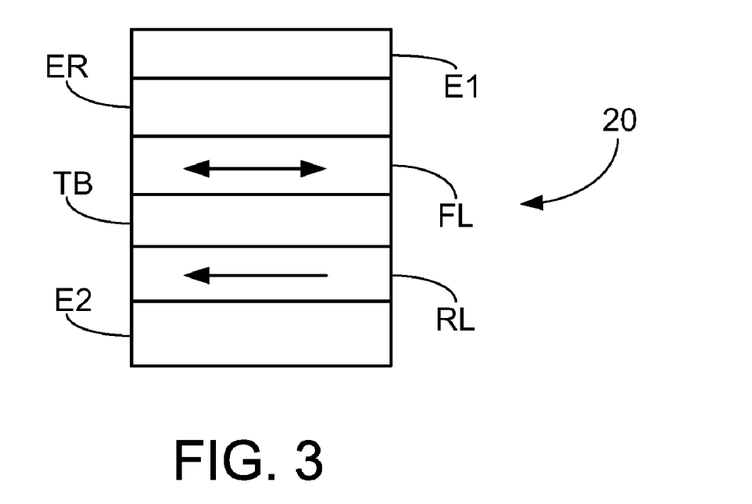
FIG. 3 is a schematic diagram of an illustrative spin-transfer torque memory unit including an electronically reflective insulative spacer.

FIG. 3 is a schematic diagram of an illustrative spin-transfer torque memory unit 20. The spin-transfer torque memory unit 20 includes a free magnetic layer FL, a reference magnetic layer RL, and an electrically insulating and non-magnetic tunneling barrier layer TB separating the free magnetic layer FL from the reference magnetic layer RL. An electrically insulating and electronically reflective layer ER separates a first electrode layer E1 from the free magnetic layer FL. A second electrode layer E2 is adjacent to the reference magnetic layer RL.

The reference magnetic layer RL can be any useful ferromagnetic material with an acceptable spin polarization range of more than 0.5, as described above. The free magnetic layer FL can be any ferromagnetic material with acceptable anisotropy, as described above. The first electrode layer E1 and the second electrode layer E2 provide a current of electrons that can switch the magnetization orientation of the free layer FL between two opposite directions and accordingly the spin-transfer torque memory unit 20 can be switched between the parallel state (i.e., low resistance state or "0" data state) and anti-parallel state (i.e., high resistance state or "1" data state) depending on the direction of the current, as described above.

The electrically insulating and electronically reflective layer ER can be a thin oxide layer or nitride layer and formed of any useful electrically insulating and electronically reflective material such as, for example, AlO, TiO, TaO, MgO, ZnO, SiO, NiO, CuO, AlN, TiN, or SiN. The thickness of the electrically insulating and electronically reflective layer ER in one embodiment can be in a range from 3 to 15 Angstroms, or from 5 to 15 Angstroms. The electrically insulating and electronically reflective layer ER in one embodiment can have an area resistance from 1 to 50 ohms$\mu m^2$ or from 1 to 20 ohms$\mu m^2$.

The electrically insulating and electronically reflective layer ER is able to reflect at least a portion of electrons back into the free layer FL and allows at least a portion of the electrons to pass through the electrically insulating and electronically reflective layer ER. These reflected electrons are able to enhance the spin current efficiency, effectively reducing the amount of current that needs to be applied through the spin-transfer torque memory unit 20 to switch the memory unit 20 between the parallel state (i.e., low resistance state or "0" data state) and anti-parallel state (i.e., high resistance state or "1" data state). Thus, since the electrically insulating and electronically reflective layer ER can reflect the spin electrons to increase the spin current efficiency, the switching current can be reduced significantly.

In some embodiments, the electrically insulating and electronically reflective layer ER can have a non-uniform thickness. The canted current resulting from this can further increase the spin efficiency to further reduce the switching current. The non-uniform electrically insulating and electronically reflective layer ER can also reduce the serial resistance to maintain the output signal. While two embodiments of a non-uniform electrically insulating and electronically reflective layer ER are shown and described below, it is understood that any non-uniform electrically insulating and electronically reflective layer ER structure is within the scope of this disclosure.

Figure 4A:
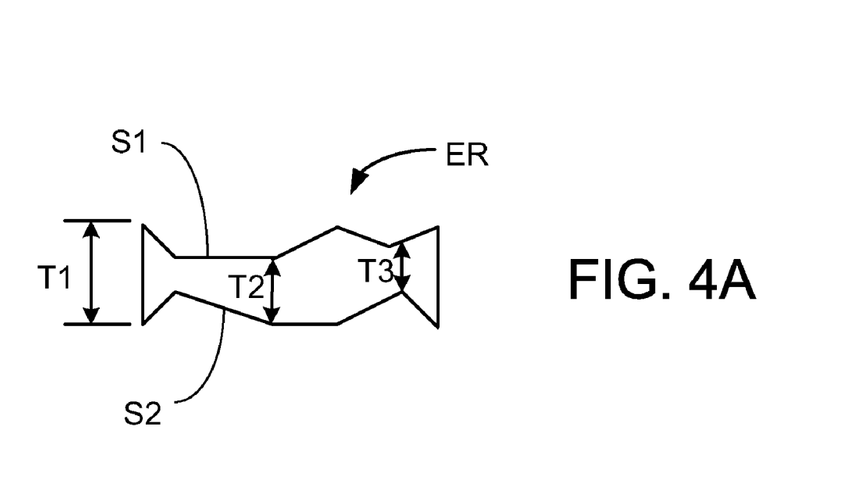
FIG. 4A is a schematic cross-sectional diagram of an illustrative non-uniform electrically insulating and electronically reflective layer.

FIG. 4A is a schematic cross-sectional diagram of an illustrative non-uniform electrically insulating and electronically reflective layer ER. In this illustrated embodiment of a electrically insulating and electronically reflective layer ER having a non-uniform thickness the electrically insulating and electronically reflective layer ER has opposing major surfaces S1 and S2 defining peaks and valleys and provide the electrically insulating and electronically reflective layer ER with a plurality of varying thicknesses T1, T2 and T3. Current travels through the opposing non-planar major surfaces S1 and S2 along a thickness direction of the electrically insulating and electronically reflective layer ER.

Figure 4B:
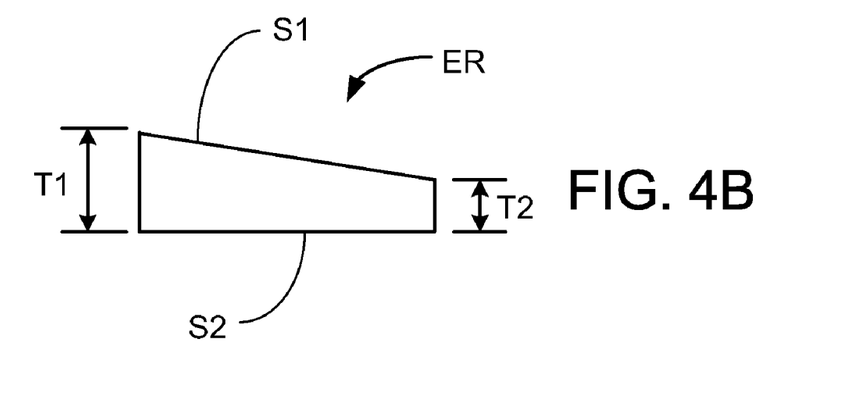
FIG. 4B is a schematic cross-sectional diagram of another illustrative non-uniform electrically insulating and electronically reflective layer.

FIG. 4B is a schematic cross-sectional diagram of another illustrative non-uniform electrically insulating and electronically reflective layer ER. In this illustrated embodiment of a electrically insulating and electronically reflective layer ER having a non-uniform thickness the electrically insulating and electronically reflective layer ER has opposing planar major surfaces S1 and S2. The opposing planar major surfaces S1 and S2 define a continuous sloping electrically insulating and electronically reflective layer ER with a first thickness T1 and decreasing to a second thickness T2. Current travels through the opposing non-planar major surfaces S1 and S2 along a thickness direction of the electrically insulating and electronically reflective layer ER.

Figure 5:
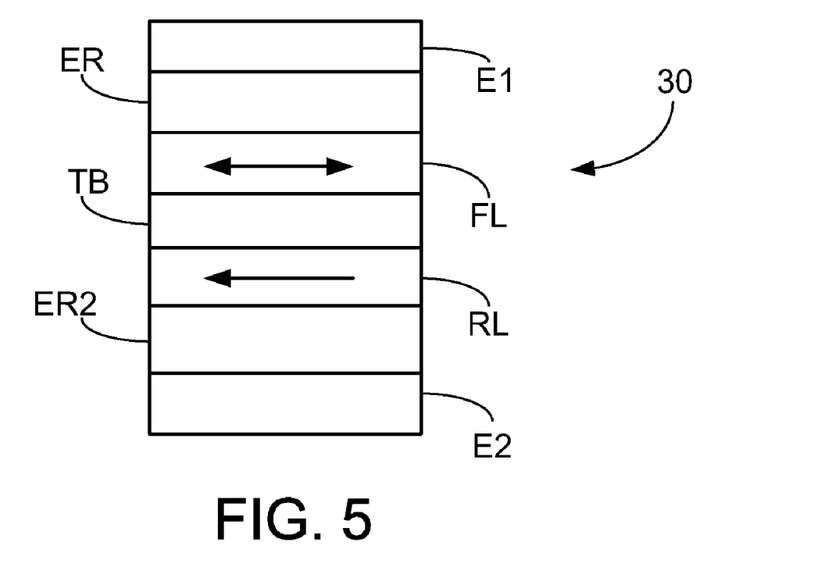
FIG. 5 is a schematic diagram of an illustrative spin-transfer torque memory unit including a second electronically reflective insulative spacer.

FIG. 5 is a schematic diagram of another illustrative spin-transfer torque memory unit 30. The spin-transfer torque memory unit 30 includes a free magnetic layer FL, a reference magnetic layer RL, and an electrically insulating and non-magnetic tunneling barrier layer TB separating the free magnetic layer FL from the reference magnetic layer RL. An electrically insulating and electronically reflective layer ER separates a first electrode layer E1 from the free magnetic layer FL. A second electrically insulating and electronically reflective layer ER2 separates a second electrode layer E2 from the reference magnetic layer RL.

The reference magnetic layer RL can be any useful ferromagnetic material with an acceptable spin polarization range of more than 0.5, as described above. The free magnetic layer FL can be any ferromagnetic material with acceptable anisotropy, as described above. The first electrode layer E1 and the second electrode layer E2 provide a current of electrons that can switch the magnetization orientation of the free layer FL between two opposite directions and accordingly the spin-transfer torque memory unit 30 can be switched between the parallel state (i.e., low resistance state or "0" data state) and anti-parallel state (i.e., high resistance state or "1" data state) depending on the direction of the current, as described above.

The electrically insulating and electronically reflective layers ER and ER2 can be independently a thin oxide layer or nitride layer and formed of any useful electrically insulating and electronically reflective material, as described above. The thickness of the electrically insulating and electronically reflective layers ER and ER2 in one embodiment can be in a range from 3 to 15 Angstroms, or from 5 to 15 Angstroms. The electrically insulating and electronically reflective layers ER and ER2 in one embodiment can have an area resistance from 1 to 50 ohms$\mu m^2$ or from 1 to 20 ohms$\mu m^2$.

The electrically insulating and electronically reflective layers ER and ER2 are able to reflect at least a portion of electrons back into the free layer FL and allows at least a portion of the electrons to pass through the electrically insulating and electronically reflective layers ER and ER2. These reflected electrons are able to enhance the spin current efficiency, effectively reducing the amount of current that needs to be applied through the spin-transfer torque memory unit 30 to switch the memory unit 30 between the parallel state (i.e., low resistance state or "0" data state) and anti-parallel state (i.e., high resistance state or "1" data state). Thus, since the electrically insulating and electronically reflective layers ER and ER2 can reflect the spin electrons to increase the spin current efficiency. The addition of a second electrically insulating and electronically reflective layer ER2 further reduces the switching current.

In some embodiments, the electrically insulating and electronically reflective layers ER and ER2 have a non-uniform thickness. The canted current resulting from this can further increase the spin efficiency to further reduce the switching current. The non-uniform electrically insulating and electronically reflective layers ER and ER2 can also reduce the serial resistance to maintain the output signal.

Figure 6:
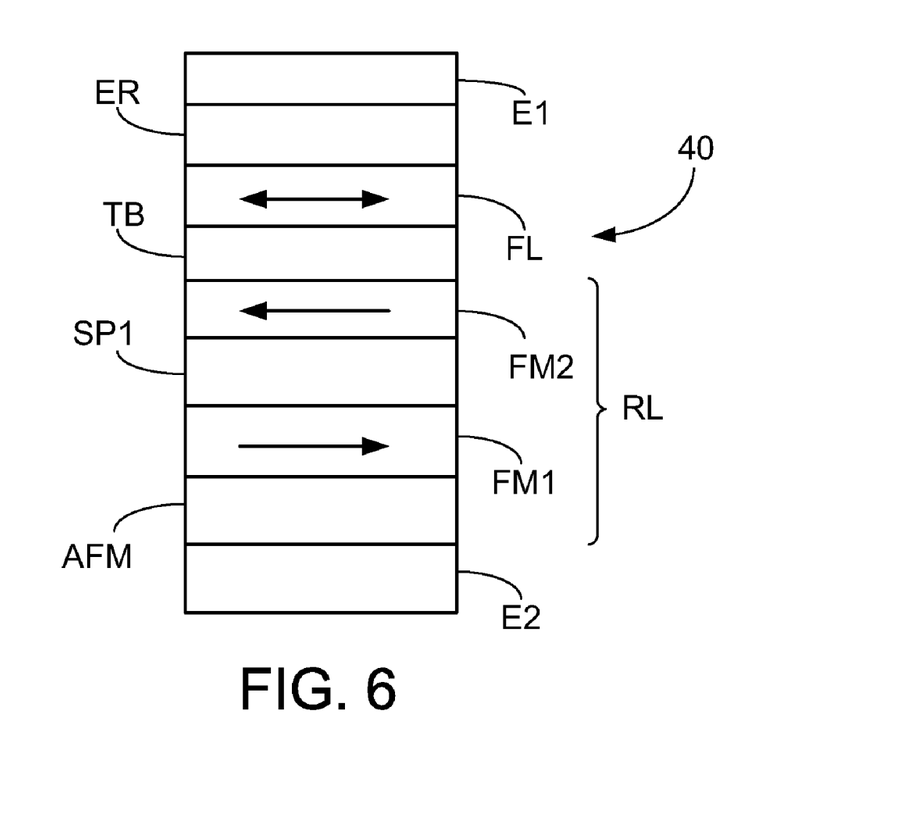
FIG. 6 is a schematic diagram of a illustrative spin-transfer torque memory unit including a multilayer reference layer.

FIG. 6 is a schematic diagram of another illustrative spin-transfer torque memory unit 40. This embodiment is similar to FIG. 3 with the addition of a synthetic anti-ferromagnetic element forming the reference layer RL. The spin-transfer torque memory unit 40 includes a free magnetic layer FL, a reference magnetic layer RL, and an electrically insulating and non-magnetic tunneling barrier layer TB separating the free magnetic layer FL from the reference magnetic layer RL. An electrically insulating and electronically reflective layer ER separates a first electrode layer E1 from the free magnetic layer FL. A second electrode layer E2 is adjacent to the reference magnetic layer RL.

The illustrated reference magnetic layer RL is referred to as a synthetic anti-ferromagnetic element. The synthetic anti-ferromagnetic element includes a first ferromagnetic layer FM1 and a second ferromagnetic layer FM2 separated by an electrically conductive and non-magnetic spacer layer SP1. The electrically conductive and non-magnetic spacer layer SP1 is configured such that the first ferromagnetic layer FM1 and a second ferromagnetic layer FM2 are anti-ferromagnetically aligned and in many embodiments, the first ferromagnetic layer FM1 and a second ferromagnetic layer FM2 have anti-parallel magnetization orientations, as illustrated. An anti-ferromagnetic layer AFM is adjacent to the second electrode layer E2. The anti-ferromagnetic layer AFM assist in pinning the magnetization orientations of the first ferromagnetic layer FM1 and a second ferromagnetic layer FM2.

There are a number of advantages of using a synthetic anti-ferromagnetic element in the disclosed spin-transfer torque memory units. Some advantages include that the static field of the free layer is reduced, the thermal stability of the reference layer is improved, and interlayer diffusion is reduced.

The first ferromagnetic layer FM1 and a second ferromagnetic layer FM2 can be any useful ferromagnetic material with an acceptable spin polarization range of more than 0.5, as described above. The anti-ferromagnetic layer AFM pins the ferromagnetic layers through, e.g., the use of exchange bias with an antiferromagnetically ordered material such as PtMn, IrMn, and others.

The electrically conductive and non-magnetic spacer layer SP1 can be formed of any useful electrically conductive and non-ferromagnetic material such as, for example, Ru, Pd, and the like. The free magnetic layer FL can be any ferromagnetic material with acceptable anisotropy, as described above. The first electrode layer E1 and the second electrode layer E2 provide a current of electrons that can switch the magnetization orientation of the free layer FL between two opposite directions and accordingly the spin-transfer torque memory unit 40 can be switched between the parallel state (i.e., low resistance state or "0" data state) and anti-parallel state (i.e., high resistance state or "1" data state) depending on the direction of the current, as described above.

The electrically insulating and electronically reflective layer ER can be a thin oxide layer or nitride layer and formed of any useful electrically insulating and electronically reflective material, as described above. The thickness of the electrically insulating and electronically reflective layer ER can be in one embodiment in a range from 3 to 15 Angstroms, or from 5 to 15 Angstroms. The electrically insulating and electronically reflective layer ER in one embodiment can have an area resistance from 1 to 50 ohms$\mu m^2$ or from 1 to 20 ohms$\mu m^2$. The electrically insulating and electronically reflective layer ER is able to reflect at least a portion of electrons back into the free layer FL while allowing a portion of the electrons to pass through the electrically insulating and electronically reflective layer ER. These reflected electrons are able to enhance the spin current efficiency, effectively reducing the amount of current that needs to be applied through the spin-transfer torque memory unit 40 to switch the memory unit 40 between the parallel state (i.e., low resistance state or "0" data state) and anti-parallel state (i.e., high resistance state or "1" data state). Thus, since the electrically insulating and electronically reflective layer ER can reflect the spin electrons to increase the spin current efficiency, the switching current can be reduced significantly.

In some embodiments, the electrically insulating and electronically reflective layer ER has a non-uniform thickness, as described above. The canted current resulting from this can further increase the spin efficiency to further reduce the switching current. The non-uniform electrically insulating and electronically reflective layer ER can also reduce the serial resistance to maintain the output signal.

Figure 7:
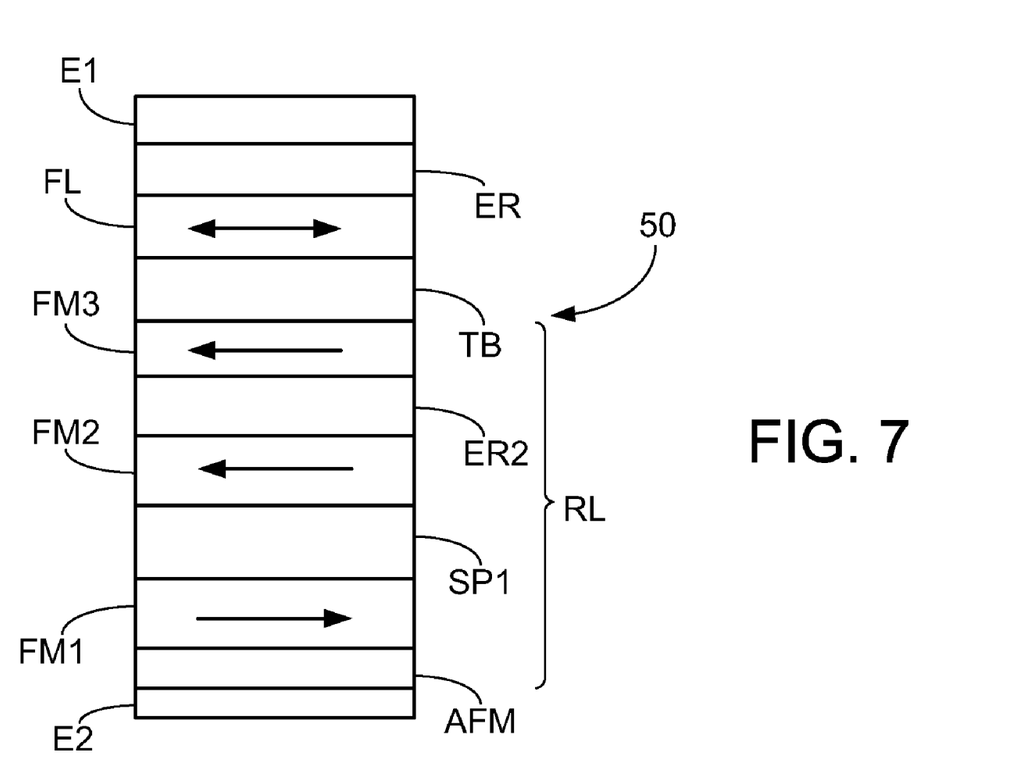
FIG. 7 is a schematic diagram of a illustrative spin-transfer torque memory unit including an alternate multilayer reference layer.

FIG. 7 is a schematic diagram of another illustrative spin-transfer torque memory unit 50. This embodiment is similar to FIG. 4 with the addition of a synthetic anti-ferromagnetic element forming the reference layer RL. The spin-transfer torque memory unit 50 includes a free magnetic layer FL, a reference magnetic layer RL, and an electrically insulating and non-magnetic tunneling barrier layer TB separating the free magnetic layer FL from the reference magnetic layer RL. An electrically insulating and electronically reflective layer ER separates a first electrode layer E1 from the free magnetic layer FL. A second electrically insulating and electronically reflective layer ER2 is disposed within the synthetic anti-ferromagnetic element forming the reference layer RL. A second electrode layer E2 is adjacent to the reference magnetic layer RL.

The illustrated reference magnetic layer RL is referred to as a synthetic anti-ferromagnetic element. The synthetic anti-ferromagnetic element includes a first ferromagnetic layer FM1 and a second ferromagnetic layer FM2 separated by an electrically conductive and non-magnetic spacer layer SP1. The electrically conductive and non-magnetic spacer layer SP1 is configured such that the first ferromagnetic layer FM1 and a second ferromagnetic layer FM2 are anti-ferromagnetically aligned and in many embodiments, the first ferromagnetic layer FM1 and a second ferromagnetic layer FM2 have anti-parallel magnetization orientations, as illustrated. An anti-ferromagnetic layer AFM is adjacent to the second electrode layer E2. The anti-ferromagnetic layer AFM assist in pinning the magnetization orientations of the first ferromagnetic layer FM1 and a second ferromagnetic layer FM2. A third ferromagnetic layer FM3 is separated from the second ferromagnetic layer FM2 by a second electrically insulating and electronically reflective layer ER2. In other embodiments, the second electrically insulating and electronically reflective layer ER2 separates other elements forming the synthetic anti-ferromagnetic element, as desired.

There are a number of advantages of using a synthetic anti-ferromagnetic element in the disclosed spin-transfer torque memory units. Some advantages include that the static field of the free layer is reduced, the thermal stability of the reference layer is improved, and interlayer diffusion is reduced.

The first ferromagnetic layer FM1, a second ferromagnetic layer FM2 and third ferromagnetic layer FM3 can be any useful ferromagnetic material with an acceptable spin polarization range of more than 0.5, as described above. The anti-ferromagnetic layer AFM pins the ferromagnetic layers through, e.g., the use of exchange bias with an antiferromagnetically ordered material such as PtMn, IrMn, and others.

The electrically conductive and non-magnetic spacer layer SP1 can be formed of any useful electrically conductive and non-ferromagnetic material such as, for example, Ru, Pd, and the like. The free magnetic layer FL can be any ferromagnetic material with acceptable anisotropy, as described above. The first electrode layer E1 and the second electrode layer E2 provide a current of electrons that can switch the magnetization orientation of the free layer FL between two opposite directions and accordingly the spin-transfer torque memory unit 50 can be switched between the parallel state (i.e., low resistance state or "0" data state) and anti-parallel state (i.e., high resistance state or "1" data state) depending on the direction of the current, as described above.

The electrically insulating and electronically reflective layers ER and ER2 can be independently a thin oxide layer or nitride layer and formed of any useful electrically insulating and electronically reflective material, as described above. The thickness of the electrically insulating and electronically reflective layers ER and ER2 in one embodiment can be in a range from 3 to 15 Angstroms, or from 5 to 15 Angstroms. The electrically insulating and electronically reflective layers ER and ER2 in one embodiment have an area resistance from 1 to 50 ohms$\mu m^2$ or from 1 to 20 ohms$\mu m^2$.

The electrically insulating and electronically reflective layers ER and ER2 are able to reflect at least a portion of electrons back into the free layer FL and allows at least a portion of the electrons to pass through the electrically insulating and electronically reflective layers ER and ER2. These reflected electrons are able to enhance the spin current efficiency, effectively reducing the amount of current that needs to be applied through the spin-transfer torque memory unit 30 to switch the memory unit 30 between the parallel state (i.e., low resistance state or "0" data state) and anti-parallel state (i.e., high resistance state or "1" data state). Thus, since the electrically insulating and electronically reflective layers ER and ER2 can reflect the spin electrons to increase the spin current efficiency, the switching current can be reduced significantly.

In some embodiments, the electrically insulating and electronically reflective layers ER and ER2 have a non-uniform thickness. The canted current resulting from this can further increase the spin efficiency to further reduce the switching current. The non-uniform electrically insulating and electronically reflective layers ER and ER2 can also reduce the serial resistance to maintain the output signal.

Thus, embodiments of the MAGNETIC TUNNEL JUNCTION WITH ELECTRONICALLY REFLECTIVE INSULATIVE SPACER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic tunnel junction, comprising:
   a free magnetic layer;
   a reference magnetic layer;
   an electrically insulating and non-magnetic tunneling barrier layer separating the free magnetic layer from the reference magnetic layer;
   an electrically insulating and electronically reflective layer positioned to reflect at least a portion of electrons back into the free magnetic layer;
   a second electrically insulating and electronically reflective layer, wherein the free magnetic layer is between the electrically insulating and electronically reflective layer and the second electrically insulating and electronically reflective layer.

2. A magnetic tunnel junction according to claim 1, wherein the electrically insulating and electronically reflective layer has a non-uniform thickness.

3. A magnetic tunnel junction according to claim 1, wherein the electrically insulating and electronically reflective layer has a thickness value in a range from 3 to 15 Angstroms.

4. A magnetic tunnel junction according to claim 1, wherein the electrically insulating and electronically reflective layer comprises AlO, TiO, MgO, ZnO, SiO, CuO, NiO, SiN, TaN or AlN.

5. A magnetic tunnel junction according to claim 1, wherein the electrically insulating and electronically reflective layer has an area resistance from 1 to 50 ohms$\mu m^2$.

6. A magnetic tunnel junction according to claim 1, wherein the free magnetic layer is between the electrically insulating and non-magnetic tunneling barrier layer and the electrically insulating and electronically reflective layer.

7. A magnetic tunnel junction according to claim 6, wherein the reference magnetic layer comprises a synthetic anti-ferromagnetic element.

8. A magnetic tunnel junction according to claim 1, wherein the second electrically insulating and electronically reflective layer has a non-uniform thickness.

9. A magnetic tunnel junction according to claim 1, wherein the second electrically insulating and electronically reflective layer has a thickness value in a range from 3 to 15 Angstroms.

10. A magnetic tunnel junction, comprising:
    a free magnetic layer;
    a reference magnetic layer;
    an electrically insulating and non-magnetic tunneling barrier layer separating the free magnetic layer from the reference magnetic layer;
    a first electrically insulating and electronically reflective layer; and
    a second electrically insulating and electronically reflective layer, wherein the free magnetic layer is between the electrically insulating and electronically reflective layer and the second electrically insulating and electronically reflective layer.

11. A magnetic tunnel junction according to claim 10, wherein at least one of the first or second electrically insulating and electronically reflective layers has a non-uniform thickness.

12. A magnetic tunnel junction according to claim 10, wherein the first and second electrically insulating and electronically reflective layers have a thickness value in a range from 3 to 15 Angstroms.

13. A magnetic tunnel junction according to claim 12, wherein the first and second electrically insulating and electronically reflective layers comprise AlO, TiO, MgO, ZnO, SiO, CuO, NiO, SiN, TaN or AlN.

14. A magnetic tunnel junction according to claim 13, wherein the first and second electrically insulating and electronically reflective layers have an area resistance from 1 to 50 ohms$\mu m^2$.

15. A magnetic tunnel junction according to claim 11, wherein the reference magnetic layer comprises a synthetic anti-ferromagnetic element.

16. A magnetic tunnel junction, comprising:
    a free magnetic layer;
    a synthetic anti-ferromagnetic reference magnetic element;
    an electrically insulating and non-magnetic tunneling barrier layer separating the free magnetic layer from the synthetic anti-ferromagnetic reference magnetic layer;
    an electrically insulating and electronically reflective layer, wherein the free magnetic layer is between the electrically insulating and electronically reflective layer and the electrically insulating and non-magnetic tunneling barrier layer;
    a comprising a second electrically insulating and electronically reflective layer disposed within the synthetic anti-ferromagnetic reference magnetic element.

17. A magnetic tunnel junction according to claim 16, wherein the electrically insulating and electronically reflective layer has a non-uniform thickness.

18. A magnetic tunnel junction according to claim 16, wherein the synthetic anti-ferromagnetic element comprises a first ferromagnetic layer, a second ferromagnetic layer, and a third ferromagnetic layer, the first and second ferromagnetic layers are anti-ferromagnetically aligned and separated by an electrically conductive and non-ferromagnetic spacer layer and an anti-ferromagnetic layer is adjacent to the first ferromagnetic layer, and the second electrically insulating and electronically reflective layer separates the second ferromagnetic layer from a third ferromagnetic layer.

* * * * *